United States Patent

[11] 3,597,524

[72] Inventors Horst Schreiner
Nurnberg;
Heinrich Hassler, Wendelstein, both of, Germany

[21] Appl. No. 859,794
[22] Filed Sept. 22, 1969
[45] Patented Aug. 3, 1971
[73] Assignee Siemens Aktiengesellschaft
Berlin, Munich, Germany
[32] Priority Sept. 21, 1968
[33] Germany
[31] P 17 89 014.1

[54] SEMICONDUCTOR DEVICE WITH A GAS AND MOISTURETIGHT HOUSING
2 Claims, 4 Drawing Figs.

[52] U.S. Cl. .......... 174/52 PE, 174/52 S, 317/234 E, 317/234 G
[51] Int. Cl. .......... H01l 9/04
[50] Field of Search .......... 317/234, 235, 1, 3, 4, 5, 5.4, 6; 174/52.5, 52.6; 29/588, 589; 264/134, 272

[56] References Cited

UNITED STATES PATENTS 3,475,662 10/1969 Zido .......... 317/234

*Primary Examiner*—John W. Huckert
*Assistant Examiner*—E. Wojciechowicz
*Attorneys*—Curt M. Avery, Arthur E. Wilfond, Herbert L. Lerner and Daniel J. Tick

ABSTRACT: A semiconductor device has a semiconductor member and a housing, the latter having portions disposed adjacent the member. Each portion is formed of porous sinter metal and has at least two regions of respectively different space-filling factors. The housing has a plastic portion contiguous to and partially penetrating the regions whereby the interior of the housing is sealed against the ingress of moisture and gas.

SEMICONDUCTOR DEVICE WITH A GAS AND MOISTURETIGHT HOUSING

Our invention relates to a semiconductor device encapsulated in a housing of sintered metal and plastic which seals the semiconductor components proper from gas and moisture.

It is an object of the invention to provide a housing or other encapsulating structure for semiconductor devices which is impermeable to gases and moisture to such an extent that even sensitive semiconductor structures will not be damaged or impaired in the event of temperature variations such as may occur during the operation of the device. The housing or encapsulation is to be suitable particularly for semiconductor bodies of monocrystalline material, such as germanium or silicon, with one or more PN junctions, for example for diodes, transistors or thyristors.

According to the invention, the housing or encapsulating structure formed of sintered metal and plastic has the portions that are constituted by porous sinter metal composed of at least two zones of respectively different space-filling factors and/or different pore sizes, and these portions are at least partially permeated by adjacent plastic material for securing a gas and moisture tight seal of the housing interior.

According to another feature of our invention, it is preferable to have a housing portion which contacts a portion of plastic material, given a space-filling factor of the porous sinter metal within the range of about 0.5 and 0.8; that is, only 50 to 80 percent of the space is preferably filled by the sintered metal. The other housing portion of the porous sinter metal which is in contact with the semiconductor component or whose external surface serves to provide a contact for the flow of operating current, has preferably, according to another feature of our invention, a space-filling factor between 0.9 and 1, that is, in this latter metallic portion the porosity is so slight that 90 percent or more of the space is filled by metal.

By virtue of configuring the sinter metal parts of the housing, a good meshing with the adjacent plastic material and consequently a rigid and tight bonding is attained. The denser regions of the porous sinter portions afford a satisfactory solder connection with the semiconductor body or, if applying a pressure contact, a reliable pressure contacting between the semiconductor body and the metallic portion of the housing. Also, the denser portions of the sintered structure permit applying a metallization, for example with tin or tin alloys, to facilitate attaching contact terminals for connecting wires.

Suitable as materials for the porous sinter body are, for example, silver, copper, iron, molybdenum, tungsten, as well as bonded metals such as WCu, MoCu, WAg, MoAg, FeCu, or the like. Suitable as plastics are synthetic press masses on epoxide resin basis, or thermoplastic synthetics.

The invention will be further described with reference to embodiments thereof which are schematically illustrated by way of example on the accompanying drawing in which.

The same reference numerals are applied in all illustrations for corresponding items respectively.

Figure 1:
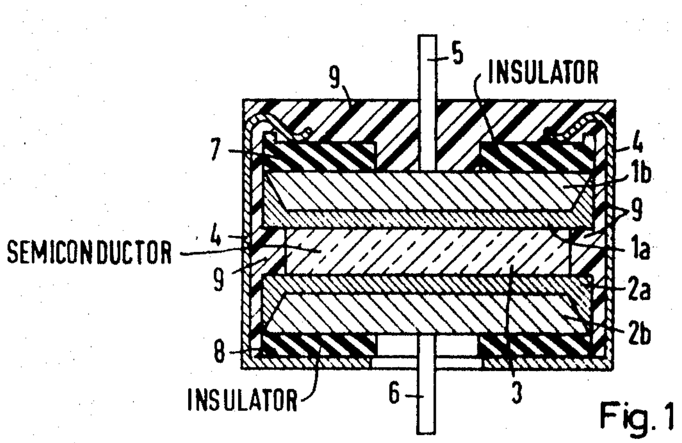
FIG. 1 is a sectional view and FIG. 2 a plan view of a semiconductor device equipped with a pressure contact.
Figure 2:
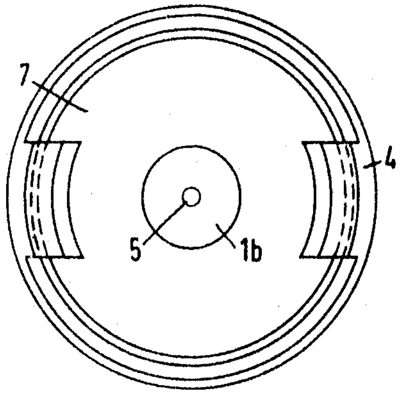

The device according to FIGS. 1 and 2 comprises a semiconductor disc 3 such as a monocrystalline circular wafer of germanium which is held by the force of a pressure spring 4 between two sinter metal discs 1 and 2. According to the invention, each of these discs is composed of two regions **1*a* and 1*b*, 2*a* and 2*b*, which differ from each other with respect to the degree of porosity and by different sizes of the pores. The sinter metal regions 1*a* and 2*a*, which are in pressure contact with the semiconductor disc 3, have a relatively low density, namely a space-filling factor of 0.5 to 0.6. The back sides 1*b* and 2*b* of the sinter metal disc, however, are given a relatively high density and have a space-filling factor between 0.9 and 1. Due to the slight porosity, the back side portions 1*b* and 2*b* or the outer surfaces thereof can readily be given a gastight design and they also permit readily soldering conductor wires 5 and 6. The semiconductor disc and the sinter metal discs are held between insulating discs 7 and 8, all of these parts being clamped together by the spring 4 and enveloped in a housing portion 9 consisting of plastic material. The plastic material penetrates at least partially into the porous disc portions 1*a* and 2*a* and thereby forms a gastight and moisture-resistant sealing of the semiconductor disc 3. The jacket 9 of plastic material and the internal components 1, 3 and 7 are not shown in FIG. 2**.

Figure 3:
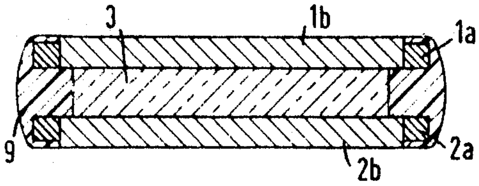
FIGS. 3 and 4 show cross-sectional views of two other embodiments of semiconductor devices suitable for soldered contact between housing and semiconductor body.
Figure 4:
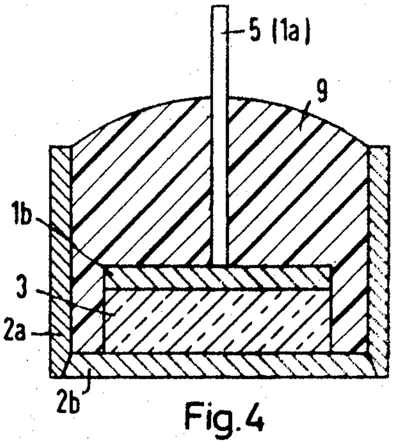

In the embodiments illustrated in FIGS. 3 and 4, the semiconductor body 3 is inserted between the gastight, for example pressed regions **1*b* and 2*b* of a plate-shaped (FIG. 3) or cup-shaped (FIG. 4) sinter metal structure. The semiconductor body is joined with the metal structure in any suitable manner, for example by soldering. The jacket 9 of plastic material, such as casting resin, is in contact with the porous regions 1*a*, 2*a* of the sinter bodies 1 and 2** and at least partially penetrates into these regions, thus forming the required seal against gas and humidity. The pressure contact, if needed, is produced by the plastic jacket which for this purpose may be subjected to pressure.

A homogeneous, dense junction between the components, which junction is also resistant to aging, can be obtained by impregnating the sinter metal portions with pure synthetic plastic prior to assembling the device. In such cases the plastic jacket 9 itself is preferably made of the same synthetic material, except that it may be provided with filler substances. When using a synthetic plastic on the basis of epoxide resin, the filler substances may consist, for example, of metal oxide or mineral meal or quartz meal. When the plastic jacket is applied, the synthetic plastic of the jacket material should reach down into the pores to join with the previously penetrated synthetic material in order to form together with the synthetic material then being pressed onto the assembly, a homogeneous duroplastic bond.

To those skilled in the art, it will be apparent from a study of this disclosure that our invention is not limited to the specific examples illustrated and described herein but may be modified in various respects so as to be incorporated in embodiments other than those shown, without departing from the spirit and features of our invention.

We claim:

1. A semiconductor device comprising a semiconductor member and a housing having portions disposed adjacent said member, each of said portions being formed of porous sinter metal and having at least two regions, one of said regions having a space-filling factor greater than said other one of said regions, said housing having a plastic portion contiguous to and partially penetrating at least one of said regions whereby the interior of said housing is sealed against the ingress of moisture and gas.

2. In a semiconductor device according to claim 1, one of said regions having a space-filling factor in the range between 0.5 and 0.8, and the other of said regions having a space-filling factor in the range between 0.9 and 1.